(12) United States Patent
Yang et al.

(10) Patent No.: US 6,987,046 B2
(45) Date of Patent: Jan. 17, 2006

(54) METHOD FOR MANUFACTURING FLASH MEMORY DEVICE

(75) Inventors: In Kwon Yang, Kyungki-Do (KR); Byoung Ki Lee, Kyungki-Do (KR); Jung Woong Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/882,451

(22) Filed: Jun. 30, 2004

(65) Prior Publication Data
US 2005/0142741 A1     Jun. 30, 2005

(30) Foreign Application Priority Data
Dec. 29, 2003 (KR) ............... 10-2003-0098833

(51) Int. Cl.
*H01L 21/8238* (2006.01)
*H01L 21/336* (2006.01)
*H01L 21/8234* (2006.01)

(52) U.S. Cl. .............. 438/257; 438/275; 438/261; 438/201

(58) Field of Classification Search ......... 438/257, 438/197, 241, 275
See application file for complete search history.

(56) References Cited
U.S. PATENT DOCUMENTS
6,784,054 B2 * 8/2004 Nitta et al. ............... 438/257
6,882,003 B2 * 4/2005 Prall et al. ............... 257/316

* cited by examiner

Primary Examiner—Chuong Anh Luu
(74) Attorney, Agent, or Firm—Marshall, Gerstein & Borun LLP

(57) ABSTRACT

The present invention discloses a method for manufacturing a flash memory device including the steps of: sequentially forming a first polysilicon film for a floating gate electrode, a first oxide film, a polysilicon film for a hard mask and a second oxide film on a semiconductor substrate; etching and patterning the second oxide film and the polysilicon film for the hard mask, by forming photoresist patterns on a predetermined region of the second oxide film, and removing the photoresist patterns; forming spacers on the sidewalls of the polysilicon film for the hard mask, by forming and etching a polysilicon film for forming spacers on the whole surface of the resulting structure; removing the exposed first oxide film and a predetermined thickness of second oxide film formed on the patterned polysilicon film for the hard mask; forming floating gate electrode patterns by performing first and second etching processes by using the patterned polysilicon film for the hard mask and the spacers as an etch mask; performing a cleaning process on the whole surface of the resulting structure, and removing the residual second oxide film at the same time; and forming control gate electrode patterns, by sequentially forming and patterning an ONO film, a second polysilicon film for a control gate electrode, a metal silicide film and a hard mask on the resulting structure on which the floating gate electrode patterns have been formed.

19 Claims, 5 Drawing Sheets

METHOD FOR MANUFACTURING FLASH MEMORY DEVICE

BACKGROUND

1. Field of the Invention

The present invention relates to a method for manufacturing a semiconductor device, and more particularly to, a method for manufacturing a flash memory device.

2. Discussion of Related Art

In general, in a method for manufacturing a flash memory device, a floating gate electrode necessarily covers an active region. Therefore, an overlay margin between the active region and a first polysilicon film for the floating gate electrode is an important variable factor.

A variety of methods such as a method for forming a first polysilicon film having a gradient, a method for forming a nitride film for a hard mask of the first polysilicon film, and a method for forming offset nitride film spacers have been used to obtain the overlay margin between the active region and the first polysilicon film for the floating gate electrode.

However, the aforementioned methods have disadvantages in that the first polysilicon film is excessively thick and damaged in removal of the nitride film.

Accordingly, there are strong demands for a technology for obtaining the overlay margin between the active region and the first polysilicon film for the floating gate electrode.

SUMMARY OF THE INVENTION

The present invention is directed to a method for manufacturing a flash memory device which can obtain an overlay margin between an active region and a first polysilicon film for a floating gate electrode.

One aspect of the present invention is to provide a method for manufacturing a flash memory device, including the steps of: sequentially forming a first polysilicon film for a floating gate electrode, a first oxide film, a polysilicon film for a hard mask and a second oxide film on a semiconductor substrate on which an device isolation film has been formed; etching and patterning the second oxide film and the polysilicon film for the hard mask by forming photoresist patterns on a predetermined region of the second oxide film, and removing the photoresist patterns; forming spacers on the sidewalls of the polysilicon film for the hard mask, by forming and etching a polysilicon film for forming spacers on the whole surface of the resulting structure; removing the exposed first oxide film and a predetermined thickness of second oxide film formed on the patterned polysilicon film for the hard mask; forming floating gate electrode patterns by performing first and second etching processes by using the patterned polysilicon film for the hard mask and the spacers as an etch mask; performing a cleaning process on the whole surface of the resulting structure, and removing the residual second oxide film at the same time; and forming control gate electrode patterns, by sequentially forming and patterning an ONO film, a second polysilicon film for a control gate electrode, a metal silicide film and a hard mask on the resulting structure on which the floating gate electrode patterns have been formed.

Preferably, the first polysilicon film is formed by using one of a doped polysilicon film, a doped amorphous silicon film, an ion-implanted polysilicon film and an ion-implanted amorphous silicon film.

Preferably, the polysilicon film for the hard mask is formed by using one of a doped polysilicon film, a doped amorphous silicon film, an undoped polysilicon film and an undoped amorphous silicon film.

Preferably, the polysilicon film for forming the spacers is formed by using one of a doped polysilicon film, a doped amorphous silicon film, an undoped polysilicon film and an undoped amorphous silicon film.

Preferably, the second oxide film and the polysilicon film for the hard mask are etched according to a dry etching process using one of $Cl_2$, HBr and F as an etching gas.

Preferably, the etching process for forming the spacers is performed so that an etching select ratio of the polysilicon film for forming the spacers to the first and second oxide films can be 10:1.

Preferably, the etching process is a dry etching process using one of $Cl_2$, HBr and F as an etching gas.

Preferably, the etching process for forming the floating gate electrode patterns is performed so that an etching select ratio of the first polysilicon film to the first oxide film can be 15:1.

Preferably, the residual second oxide film is removed so that an etching select ratio of the polysilicon film for the hard mask and the spacers to the first oxide film can be 15:1.

According to another aspect of the present invention, a method for manufacturing a flash memory device includes the steps of: sequentially forming a first polysilicon film for a floating gate electrode and a nitride film on a semiconductor substrate on which an device isolation film has been formed, and forming photoresist patterns on a predetermined region of the nitride film; etching and patterning the nitride film by using the photoresist patterns as an etch mask; etching and patterning the first polysilicon film by using the patterned nitride film as an etch mask; removing the photoresist patterns; finishing formation of floating gate electrode patterns by removing the patterned nitride film; and forming control gate electrode patterns, by sequentially forming and patterning an ONO film, a second polysilicon film for a control gate electrode, a metal silicide film and a hard mask on the resulting structure on which the floating gate electrode patterns have been formed.

Preferably, the nitride film is etched according to first and second etching processes.

Preferably, the first etching process is performed by using $CHF_3$ and $CF_4$ as main gases and one of Ar, $O_2$, $N_2$, HBr and $Cl_2$ as an additive gas.

Preferably, the second etching process is performed by using one of $CHF_3$ and HBr as a main gas.

Preferably, the first polysilicon film is etched by using HBr and $Cl_2$ as main gases and $N_2$ or $O_2$ as an additive gas.

DETAILED DESCRIPTION OF PREFERRED EMBODIMENTS

Figure 1:
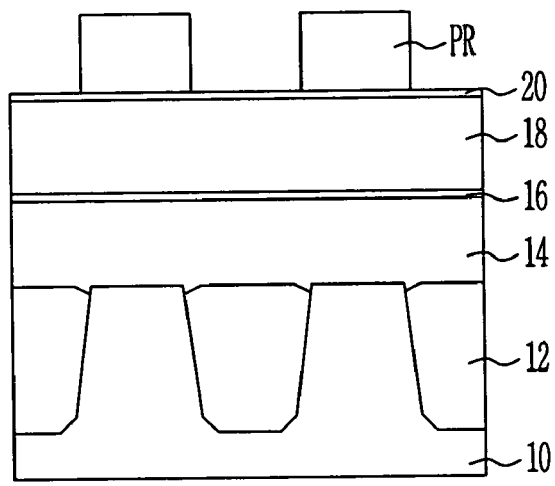
FIGS. 1 to 8 are cross-sectional diagrams illustrating sequential steps of a method for manufacturing a flash memory device in accordance with a first embodiment of the present invention.

A method for manufacturing a flash memory device in accordance with preferred embodiments of the present invention will now be described in detail with reference to the accompanying drawings. In the case that it is described that one film is disposed on or contacts another film or a semiconductor substrate, one film can directly contact another film or the semiconductor substrate, or the third film can be positioned between them. Wherever possible, the same reference numerals will be used throughout the drawings and the description to refer to the same or like parts.

FIGS. 1 to 8 are cross-sectional diagrams illustrating sequential steps of a method for manufacturing a flash memory device in accordance with a first embodiment of the present invention.

Referring to FIG. 1, a first polysilicon film 14 for a floating gate electrode, a first oxide film 16, a polysilicon film 18 for a hard mask and a second oxide film 20 are sequentially formed on a semiconductor substrate 10 on which an device isolation film 12 has been formed. Photoresist patterns PR are formed on a predetermined region of the second oxide film 20.

The first polysilicon film 14 is formed at a thickness of 500 to 2000 Å by using one of a doped polysilicon film, a doped amorphous silicon film, an ion-implanted polysilicon film and an ion-implanted amorphous silicon film.

The first oxide film 16 is formed at a thickness of 60 to 150 Å.

A thickness of the polysilicon film 18 for the hard mask is different from that of the first polysilicon film 14 by −300 to 500 Å. The polysilicon film 18 for the hard mask is formed by using one of a doped polysilicon film, a doped amorphous silicon film, an undoped polysilicon film and an undoped amorphous silicon film.

The second oxide film 20 is formed at a thickness of 100 to 500 Å.

The first oxide film 16 is deposited to be used as an etch barrier film for the polysilicon film 14 in a succeeding etching process for forming a floating gate electrode. Here, a thickness of the first oxide film 16 is dependent upon the thickness of the lower first polysilicon film 14 and the thickness of the upper polysilicon film 18 for the hard mask.

That is, if the first oxide film 16 is too thick, the first oxide film 16 is not removed in a succeeding cleaning process, and thus a thickness of a succeeding deposition layer is not even. If the first oxide film 16 is too thin, the first oxide film 16 is not operated as the etch barrier film for the lower polysilicon film in the succeeding etching process for forming the floating gate electrode. Therefore, the thickness of the first oxide film 16 is dependent upon the thickness of the first polysilicon film 14 and the thickness of the polysilicon film 18 for the hard mask.

The second oxide film 20 serves as an etch barrier film for the polysilicon film 18 for the hard mask in a succeeding etching process for forming spacers.

Figure 2:
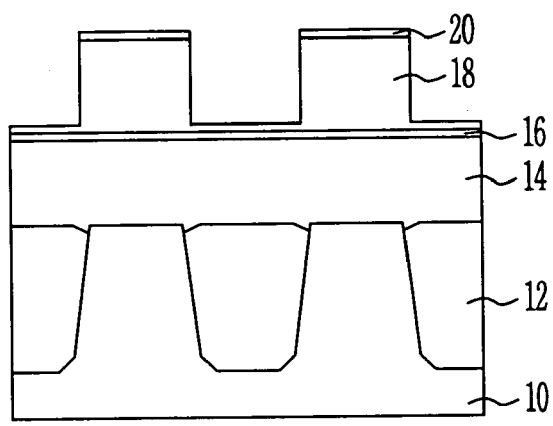

As shown in FIG. 2, the second oxide film 20 and the polysilicon film 18 for the hard mask are etched and patterned by using the photoresist patterns PR as an etch mask. Thereafter, the photoresist patterns are removed.

The etching process is performed to remove the whole thickness of second oxide film 20 and a predetermined thickness of polysilicon film 18 for the hard mask without exposing the first oxide film 16. After the etching process, the polysilicon film 18 for the hard mask is left on the first oxide film 16 at a thickness of 100 to 300 Å. After a strip process for removing the photoresist patterns PR, a cleaning process is performed on the whole surface of the resulting structure.

The etching process is a dry etching process using one of $Cl_2$, HBr and F as an etching gas.

Figure 3:
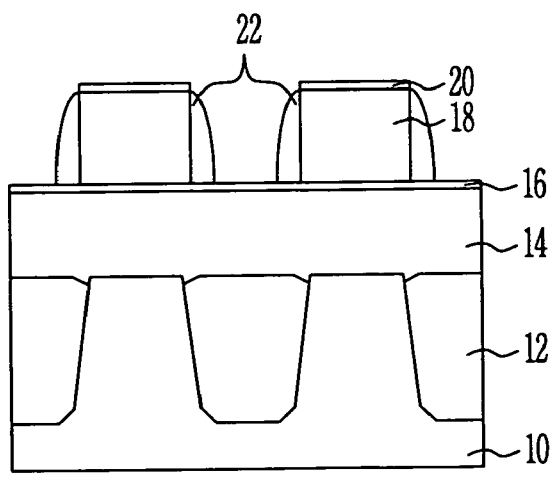

As illustrated in FIG. 3, spacers 22 are formed on the sidewalls of the polysilicon film 18 for the hard mask, by forming and etching a polysilicon film for forming spacers on the whole surface of the resulting structure.

The polysilicon film for forming the spacers is formed by using one of a doped polysilicon film, a doped amorphous silicon film, an undoped polysilicon film and an undoped amorphous silicon film.

The spacers 22 are formed to obtain spaces between floating gate electrode patterns.

The etching process for forming the spacers 22 uses an etching select ratio for preventing the first and second oxide films 16 and 20 from being easily removed. Here, the etching select ratio of the polysilicon film for forming the spacers to the first and second oxide films 16 and 20 can be 10:1.

The etching process is a dry etching process using one of $Cl_2$, HBr and F as an etching gas.

Figure 4:
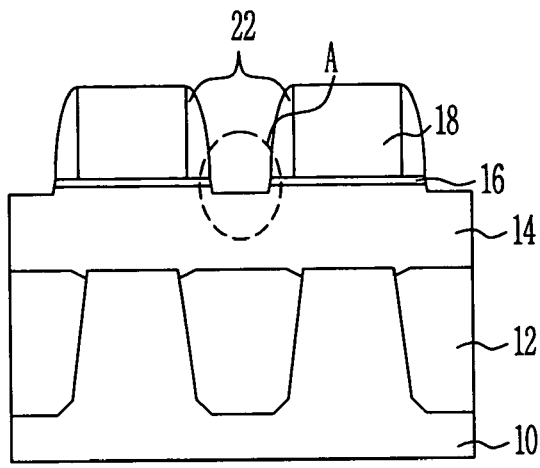

As depicted in FIG. 4, an etching process is performed to remove the patterned polysilicon film 18 for the hard mask, the first oxide film 16 exposed because the spacers 22 have not been formed, and the second oxide film 20 formed on the patterned polysilicon film 18 for the hard mask.

An etching process having a high etching select ratio for the oxide film is performed to completely remove the exposed first oxide film 16, which may damage the first polysilicon film 14 for the floating gate electrode (refer to A of FIG. 4).

Figure 5:
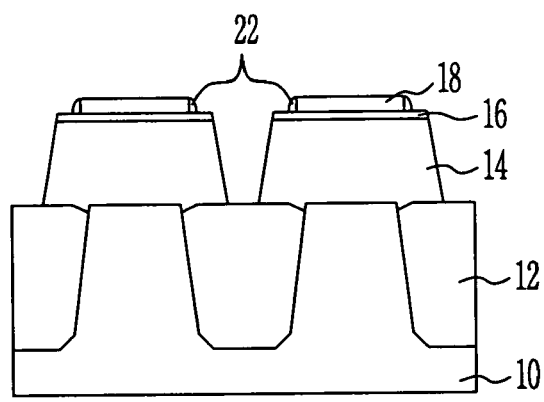

As illustrated in FIG. 5, floating gate electrode patterns are formed by performing a first etching process on the first polysilicon film 14 by using the patterned polysilicon film 18 for the hard mask and the spacers 22 as an etch mask. The first etching process uses an etching select ratio for preventing loss of the first oxide film 16 formed below the polysilicon film 18 for the hard mask, and etching the first polysilicon film 14. Here, the etching select ratio of the first polysilicon film 14 to the first oxide film 16 can be 15:1. Accordingly, the top edges of the floating gate electrode patterns are protected, and the patterned polysilicon film 18 for the hard mask and the spacers 22 used as the etch mask are left.

Figure 6:
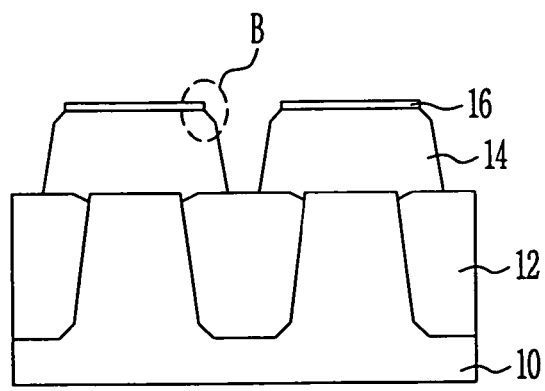

Referring to FIG. 6, the residual polysilicon film 18 for the hard mask and the residual spacers 22 are removed by performing a second etching process on the whole surface of the resulting structure.

The second etching process uses an etching select ratio for completely removing the residual polysilicon film 18 for the hard mask and the residual spacers 22, and partially removing the first oxide film 16. Here, the etching select ratio of the polysilicon film 18 for the hard mask and the spacers 22 to the first oxide film 16 can be 10 or less:1.

Therefore, the first oxide film 16 is partially removed and the top corners of the floating gate electrode patterns are rounded at the same time (refer to B of FIG. 6).

Figure 7:
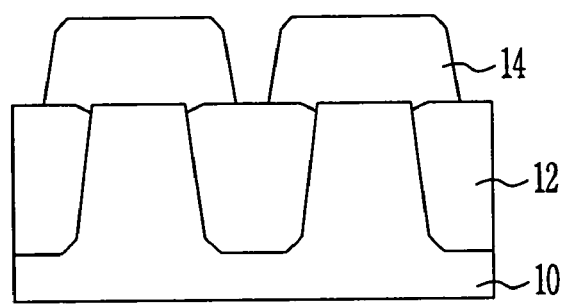

As shown in FIG. 7, a cleaning process is performed on the whole surface of the resulting structure after the second etching process and before deposition of an ONO film, respectively. The residual first oxide film 16 is wholly removed according to the two cleaning processes, to finish formation of the floating gate electrode patterns.

Figure 8:
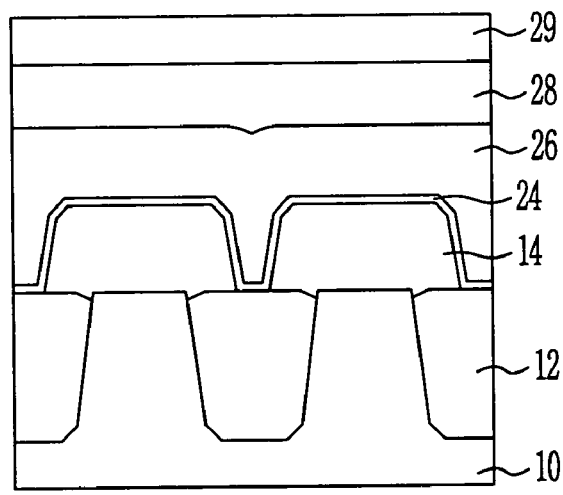

As depicted in FIG. 8, control gate electrode patterns are formed, by sequentially forming and patterning an ONO film 24, a second polysilicon film 26 for a control gate electrode, a metal silicide film 28 and a hard mask 29 on the resulting structure on which the floating gate electrode patterns have been formed. Thus, the process for forming the gate electrode patterns of the flash memory device is finished.

In accordance with the first embodiment of the present invention, the method for manufacturing the flash memory device can obtain an overlay margin between the first polysilicon film and an active region due to a small thickness of the first polysilicon film and a thickness of the spacers comprised of the polysilicon film.

In accordance with the first embodiment of the present invention, the method for manufacturing the flash memory device can prevent damages of the first polysilicon film and surface roughness which may be caused in the process for removing the nitride film, by forming the first and second oxide films and the spacers comprised of the polysilicon film.

FIGS. 9 to 14 are cross-sectional diagrams illustrating sequential steps of a method for manufacturing a flash memory device in accordance with a second embodiment of the present invention.

Figure 9:
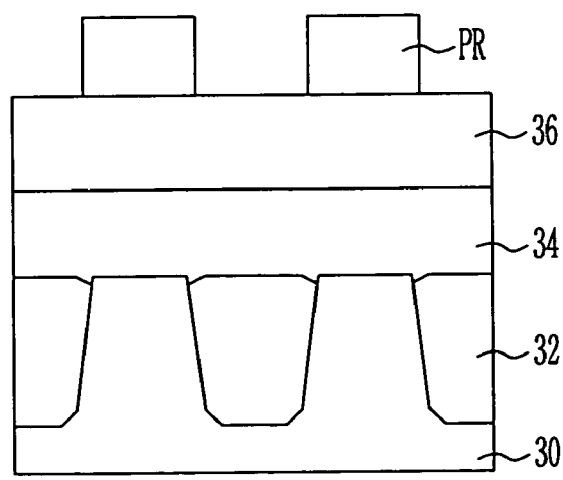
FIGS. 9 to 14 are cross-sectional diagrams illustrating sequential steps of a method for manufacturing a flash memory device in accordance with a second embodiment of the present invention.

As illustrated in FIG. 9, a first polysilicon film 34 for a floating gate electrode and a nitride film 36 are sequentially formed on a semiconductor substrate 30 on which an device isolation film 32 has been formed. Photoresist patterns PR are formed on a predetermined region of the nitride film 36.

Figure 10:
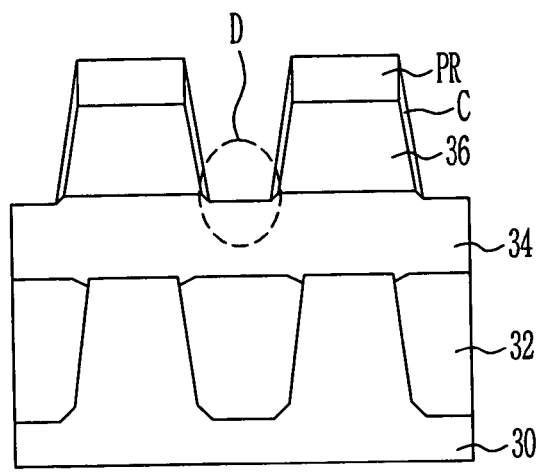

Referring to FIG. 10, the nitride film 36 is etched and patterned by using the photoresist patterns PR as an etch mask. Here, the nitride film 36 is patterned according to two etching processes, namely first and second etching processes. The first etching process defines the nitride film to be used as an etch mask of a floating gate electrode, by using $CHF_3$ and $CF_4$ as main gases and one of Ar, $O_2$, $N_2$, HBr and $Cl_2$ as an additive gas. The second etching process rounds the top corners of the floating gate electrode, by using one of $CHF_3$ and HBr as a main gas.

In the first etching process, polymers are excessively generated and deposited (refer to C of FIG. 10). The nitride film 36 has a 85° profile, and the polymers are deposited on the exposed top surface of the first polysilicon film 34. The etching process is performed by using the deposited nitride film polymers and the polymers deposited on the first polysilicon film 34 as an etch mask, thereby rounding the top corners of the first polysilicon film 34 (refer to D of FIG. 10).

The rounded top corners of the first polysilicon film 34 prevent an overhang profile of the first polysilicon film 34 in a succeeding process for removing the nitride film 36.

Figure 11:
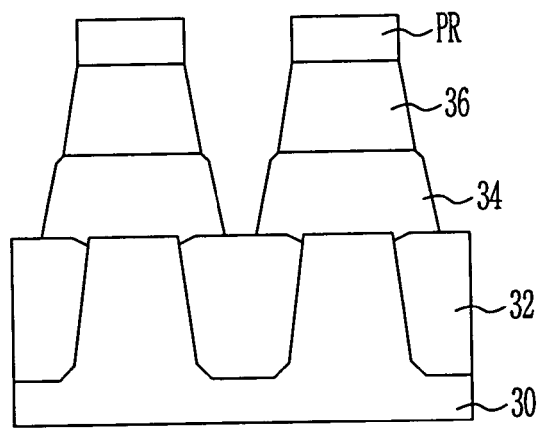

As depicted in FIG. 11, floating gate electrode patterns are formed by etching the first polysilicon film 34 by using the patterned nitride film 36 as an etch mask. The first polysilicon film 34 has a 85° profile by the 85° profile of the nitride film 36. In the etching process, HBr and $Cl_2$ are used as main gases and $N_2$ or $O_2$ is used as an additive gas.

Figure 12:
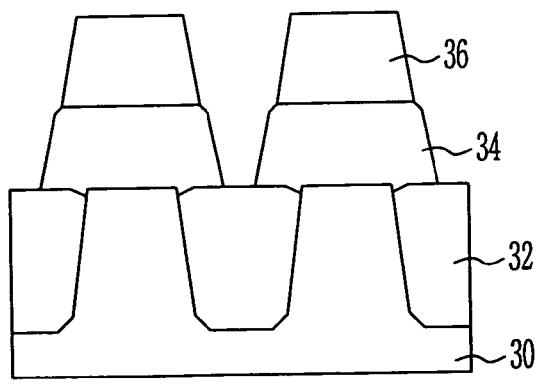

As illustrated in FIG. 12, the photoresist patterns PR are removed. A cleaning process is performed to remove the residues of the preceding process.

Figure 13:
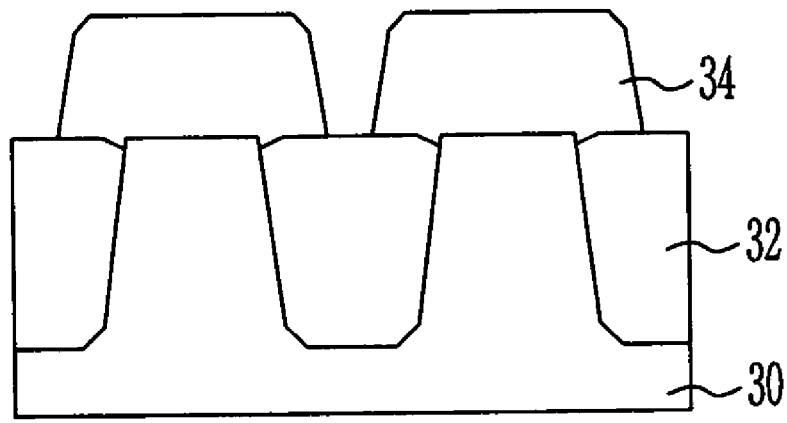

As shown in FIG. 13, a process for removing the patterned nitride film 36 is performed, to finish formation of the floating gate electrode patterns.

Figure 14:
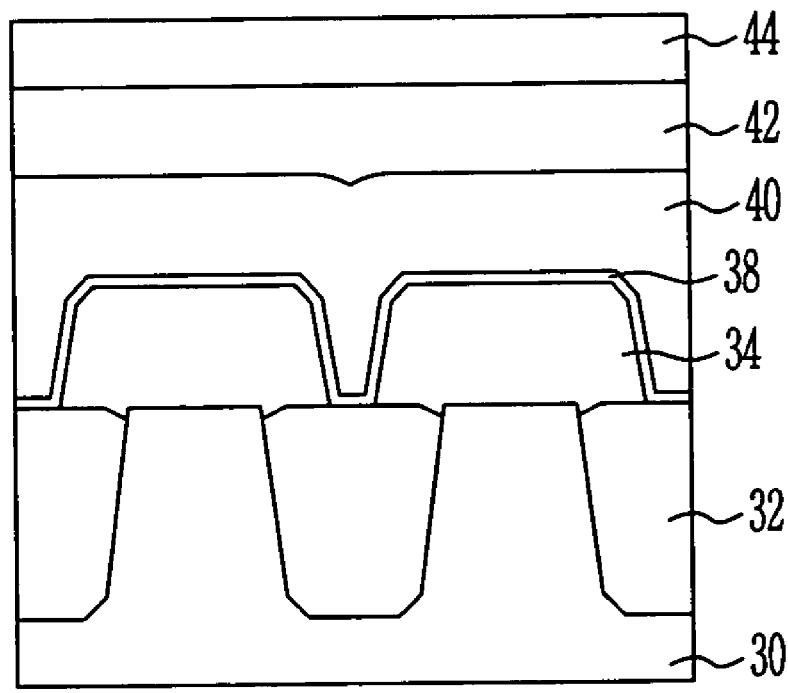

Referring to FIG. 14, control gate electrode patterns are formed, by sequentially forming and patterning an ONO film 38, a second polysilicon film 40 for a control gate electrode, a metal silicide film 42 and a hard mask 44 on the resulting structure on which the floating gate electrode patterns have been formed. Therefore, the process for forming the gate electrode patterns of the flash memory device is finished.

In accordance with the second embodiment of the present invention, the method for manufacturing the flash memory device can obtain an overlay margin between the first polysilicon film and an active region due to a small thickness of the first polysilicon film and a thickness of the nitride film.

In accordance with the second embodiment of the present invention, the method for manufacturing the flash memory device can prevent damages of the first polysilicon film and surface roughness which may be caused in the process for removing the nitride film, by omitting the process for forming spacers.

As discussed earlier, in accordance with the present invention, the method for manufacturing the flash memory device can obtain the overlay margin between the first polysilicon film and the active region due to a small thickness of the first polysilicon film and a thickness of the spacers comprised of the polysilicon film.

In addition, the method for manufacturing the flash memory device can prevent damages of the first polysilicon film and surface roughness which may be caused in the process for removing the nitride film, by omitting the process for forming the spacers, or forming the first and second oxide films and the spacers comprised of the polysilicon film.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for manufacturing a flash memory device, comprising the steps of:
   sequentially forming a first polysilicon film, a first oxide film, a second polysilicon film and a second oxide film on a semiconductor substrate on which an device isolation film has been formed;
   etching portions of the second oxide film and the second polysilicon film by using photoresist patterns formed on a predetermined region of the second oxide film as an etch mask, and removing the photoresist patterns;
   forming a third polysilicon film on the whole surface of the resulting structure and etching the third polysilicon film to form spacers on the sidewalls of the second polysilicon film, thereby forming a first hard mask having the second polysilicon film and the spacers;
   removing the exposed first oxide film and the second oxide film remaining on the first hard mask;
   forming floating gate electrode patterns by etching the first polysilicon film with the first hard mask as an etch mask;
   removing the first hard mask; and,
   sequentially forming and patterning an ONO film, a fourth polysilicon film, a metal silicide film and a second hard mask on the resulting structure on which the floating gate electrode patterns have been formed, whereby control gate electrode patterns are formed.

2. The method of claim 1, wherein the first polysilicon film for the floating gate electrode is formed by using one of a doped polysilicon film, a doped amorphous silicon film, an ion-implanted polysilicon film and an ion-implanted amorphous silicon film.

3. The method of claim 1, wherein the polysilicon film for the hard mask is formed by using one of a doped polysilicon film, a doped amorphous silicon film, an undoped polysilicon film and an undoped amorphous silicon film.

4. The method of claim 1, wherein the polysilicon film for forming the spacers is formed by using one of a doped polysilicon film, a doped amorphous silicon film, an undoped polysilicon film and an undoped amorphous silicon film.

5. The method of claim 1, wherein the second oxide film and the polysilicon film for the hard mask are etched according to a dry etching process using one of $Cl_2$, HBr and F as an etching gas.

6. The method of claim 1, wherein the etching process for forming the spacers is performed so that an etching select ratio of the polysilicon film for forming the spacers to the first and second oxide films can be 10:1.

7. The method of claim 6, wherein the etching process is a dry etching process using one of $Cl_2$, HBr and F as an etching gas.

8. The method of claim 1, wherein the etching process for forming the floating gate electrode patterns is performed so that an etching select ratio of the first polysilicon film to the first oxide film can be 15:1.

9. The method of claim 1, wherein the residual second oxide film is removed so that an etching select ratio of the polysilicon film for the hard mask and the spacers to the first oxide film can be 15:1.

10. A method for manufacturing a flash memory device, comprising the steps of:
sequentially forming a first polysilicon film and a nitride film on a semiconductor substrate on which a device isolation film has been formed, and forming photoresist patterns on a predetermined region of the nitride film;
etching the nitride film by first and second etching processes using the photoresist patterns as an etch mask, wherein the first etching process is performed so that polymers are excessively generated and the nitride film has a slope profile, and wherein the second etching processes performed by using the nitride film having the slope profile as an etch mask, thereby rounding the top corners of the first polysilicon film;
etching the first polysilicon film by using the patterned nitride film as an etch mask;
removing the photoresist patterns;
removing the patterned nitride film to form floating gate electrode patterns; and
sequentially forming and patterning an ONO film, a second polysilicon film, a metal silicide film and a hard mask on the resulting structure on which the floating gate electrode patterns have been formed, whereby control gate electrode patterns are formed.

11. The method of claim 10, wherein the first etching process is performed by using $CHF_3$ and $CF_4$ as main gases and one of Ar, $O_2$, $N_2$, HBr and $Cl_2$ as an additive gas.

12. The method of claim 10, wherein the second etching process is performed by using one of $CHF_3$ and HBr as a main gas.

13. The method of claim 10, wherein the first polysilicon film is etched by using HBr and $Cl_2$ as main gases and $N_2$ or $O_2$ as an additive gas.

14. A method for manufacturing a flash memory device, comprising the steps of:
sequentially forming a first polysilicon film, a first oxide film, a second polysilicon film and a second oxide film on a semiconductor substrate on which a device isolation film has been formed;
etching portions of the second oxide film and the second polysilicon film;
forming spacers on the sidewalls of the second polysilicon film, wherein the spacers are formed of a polysilicon film;
removing the exposed first oxide film and the second oxide film;
forming floating gate electrode patterns by etching the first polysilicon film by using the second polysilicon film and the spacers as an etch mask, so that the second polysilicon film and the spacers are removed; and
sequentially forming and patterning an ONO film, a third polysilicon film, a metal silicide film and a hard mask on the resulting structure on which the floating gate electrode patterns have been formed, whereby control gate electrode patterns are formed,
wherein the floating gate patterns are formed that partially overlap with device isolation film.

15. The method of claim 14, wherein the second oxide film and the second polysilicon film are etched by a dry etching process using one of $Cl_2$, HBr and F as an etching gas.

16. The method of claim 14, wherein the spacers are formed by an etching process so that an etching select ratio of the polysilicon film for forming the spacers to the first and second oxide films can be 10:1 after the formation of the polysilicon film for forming spacers on the whole surface of the resulting structure.

17. The method of claim 16, wherein the etching process is a dry etching process using one of $Cl_2$, HBr and F as an etching gas.

18. The method of claim 14, wherein the etching process for forming the floating gate electrode patterns is performed so that an etching select ratio of the first polysilicon film to the first oxide film can be 15:1.

19. The method of claim 14, wherein the residual second oxide film is removed so that an etching select ratio of the polysilicon film for the hard mask and the spacers to the first oxide film can be 15:1.

* * * * *